United States Patent [19]

Cutrer et al.

[11] Patent Number: 5,668,562

[45] Date of Patent: Sep. 16, 1997

[54] MEASUREMENT-BASED METHOD OF OPTIMIZING THE PLACEMENT OF ANTENNAS IN A RF DISTRIBUTION SYSTEM

[75] Inventors: David M. Cutrer, Walnut Creek; John B. Georges, Berkeley; Kam Y. Lau, Danville, all of Calif.

[73] Assignee: LGC Wireless, Inc.

[21] Appl. No.: 635,300

[22] Filed: Apr. 19, 1996

[51] Int. Cl.⁶ ................................................ G01R 29/10
[52] U.S. Cl. ........................ 343/703; 343/893; 342/165; 455/67.1
[58] Field of Search ........................ 343/703, 893, 343/894, 876; 342/165, 360, 450; 455/62, 63, 67.4, 67.1; G01R 29/10

[56] References Cited

U.S. PATENT DOCUMENTS

| | | | |
|---|---|---|---|
| 5,151,704 | 9/1992 | Gunmar et al. | 342/360 |
| 5,179,722 | 1/1993 | Gunmar et al. | 455/33.1 |
| 5,293,640 | 3/1994 | Gunmar et al. | 455/33.1 |
| 5,321,736 | 6/1994 | Beasley | 379/58 |
| 5,381,444 | 1/1995 | Tajima | 375/1 |
| 5,507,010 | 4/1996 | Ahomen | 343/703 |

*Primary Examiner*—Hoanganh T. Le
*Attorney, Agent, or Firm*—Lumen Intellectual Property Services

[57] ABSTRACT

The placement of repeater or base station antennas in an in-building or urban wireless RF communications network is optimized using field measurements. Test antennas are placed at a number of sites within the coverage area, and the signal from each test antenna is measured at different locations within the coverage area. The measurement allows the simulation of the coverage provided by different arrangements of antennas. An optimum arrangement can then be chosen. The optimum arrangement of antennas is chosen by maximizing a utility function that depends on the quality of the coverage within the area and on the cost of installing an arrangement. A database of architectural categories (building plans) and measurement results for each category is built by a method of the present invention. A new building is then matched to the closest component categories in the database, thus allowing the optimization of coverage in a coverage area without the measurement of signals from nest antennas in the new building.

30 Claims, 8 Drawing Sheets

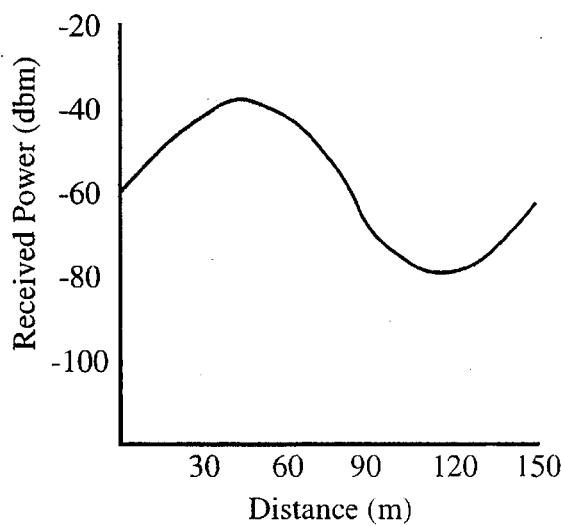
FIG. 11-A
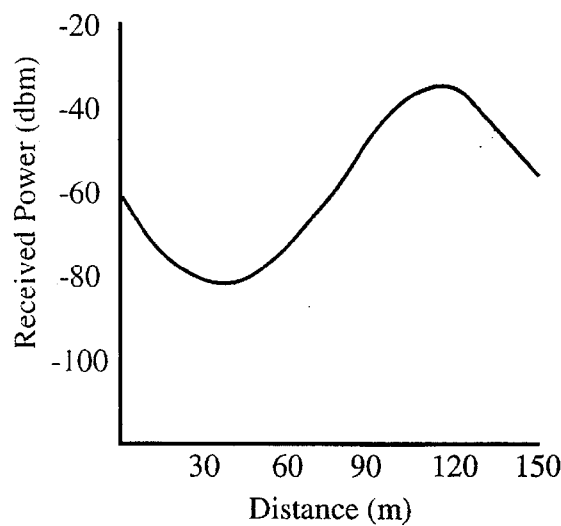
FIG. 11-B
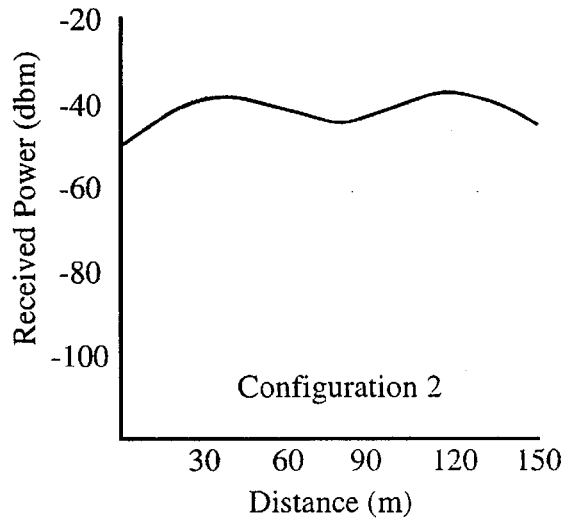
FIG. 12-A
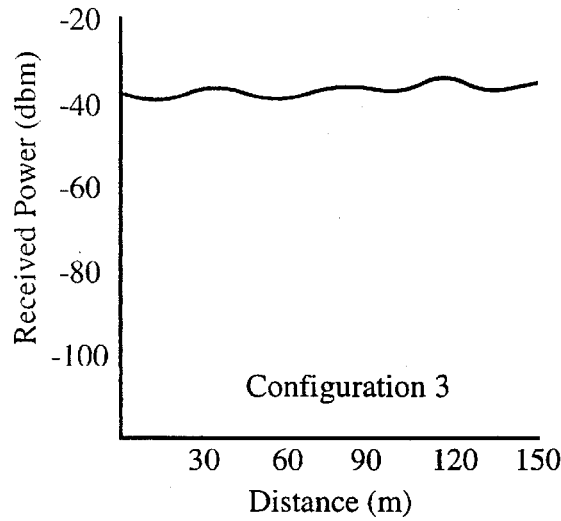
FIG. 12-B

MEASUREMENT-BASED METHOD OF OPTIMIZING THE PLACEMENT OF ANTENNAS IN A RF DISTRIBUTION SYSTEM

FIELD OF THE INVENTION

The present invention relates to the field of distributed antenna networks for communications, and in particular to a method and apparatus for optimizing the placement of antennas in a RF distribution system.

DESCRIPTION OF PRIOR ART

The demand for wireless services such as pager communications and cordless and cellular telephony continues to grow. Wireless service providers are increasingly searching for new techniques for extending their wireless services inside of buildings and complex urban areas. By extending service into these areas the service providers aim to supply ubiquitous radio coverage, allowing the provision of service at all locations and at all times.

The most prevalent means for providing radio frequency (RF) distribution to these areas is the use of distributed antennas (repeaters) that deliver signals between communications units within a building, and a distribution point (hub). Typical communications units include cellular and cordless phones, and pagers. Hubs are usually located on the roof or in the basement of a building, and collect and send signals to/from a plurality of antennas in the building.

Installation of a distributed indoor network of antennas is very costly. Installation costs include the hardware costs of antennas and links connecting antennas to the hub, and labor and other costs associated with placing antennas and links at sites within the building. Often, the building owner is compensated for the disruption caused by the installation process. Since installation costs are substantial, it is important to optimize the placement of antennas within the building in order to provide uniform radio coverage with an optimum (low) number of antennas and links. Moreover, since post-installation changes in the distribution system configuration are also costly, it is desirable for a system engineer to ensure that a distribution system will perform to specified values before the system is installed.

No current methodology exists for optimizing distribution system architectures inside buildings. The approach typically taken currently by system designers is to blanket the coverage area (such as a building) with antennas. The typical approach is not only costlier than necessary, but also can lead to undesired interference between signals from different antennas. The need for an antenna placement optimization method is especially acute for in-building antenna networks. Such a method would also be useful, however, for optimizing the placement of base stations in a complex urban area.

Several U.S. Patents address the issue of antenna placement optimization, and the use of on-site measurements of coverage parameters. In U.S. Pat. No. 5,321,736, Beasley describes a distributed RF repeater arrangement for increasing the coverage area of a base station. The placement of the RF repeaters is optimized so as to reduce the number of call hand-offs required as the user of a handset roams around from the coverage area of one repeater to those of other repeaters. The optimization is done by connecting repeater antennas along a traffic path (such as a walkway in a mall) together, so that call hand-offs are not required while the handset moves along the traffic path. The disclosed method optimizes the antenna placement using measurements of the traffic patterns in the coverage area. The Beasley patent does not discuss, however, optimizing the placement of repeaters based on the signal quality and cost of the coverage provided by the antennas.

Other U.S. patents discuss the optimization of the performance of RF distribution networks using field measurements of signal strengths from existing base stations. For example, in U.S. Pat. No. 5,151,704, Gunmar et al. disclose a method of deriving simulated field strength values for a proposed base station antenna to be placed at the site of an existing antenna, using measured field strength values from the existing antenna. An operator first measures the signal strengths from an existing base station antenna at many locations within the coverage area; the signal strengths depend on the ideal radiation pattern of the antenna (the radiation pattern in the absence of obstacles), and on the obstacle geometry in the coverage area. Using the collected data and known ideal radiation patterns for other types of antennas, one can simulate expected field strengths within the coverage area for such other types of antennas placed at the site of the existing antenna. A simulated field strength is obtained by scaling the actual field strength measurement (for the existing antenna) by the ratio of the known ideal field strength for the new antenna to the ideal field strength of the existing type of antenna. The method is aimed at optimizing the type (i.e. power, ideal radiation pattern) and orientation of an antenna placed at a particular site, and not at optimizing the installation site.

In U.S. Pat. No. 5,179,722, Gunmar et al. discuss a method of assessing interference in a coverage area of a communications distribution system, using field strength measurements in the area. The measurements are used to optimize channel allocations between the base stations of the distribution network.

In U.S. Pat. No. 5,293,640, Gunmar et al. disclose a method of planning radio cells using field measurements of signal strengths from existing base stations. The primary goal of the invention is to optimize channel and coverage area allocations between different radio cells. The type and power of the antennas used, and the channel allocations are used as parameters in the system optimization. If coverage cannot be adequately provided by an existing configuration, at least one radio cell is divided into two smaller cells. The disclosed method focuses on optimizing the performance of a base station network already in place, and does not address optimizing the system performance by determining the most suitable antenna placement. Also, measuring the signal strengths from only a small number of existing installed base stations cannot be used for adequately determining the optimal placement of new antennas in a coverage area.

In U.S. Pat. No. 5,381,444, Tajima describes several embodiments of an apparatus suitable for taking field measurements of signal strengths from fixed antennas. The patent does not address, however, how field data taken using the disclosed apparatus can be used to optimize the placement of antennas within a coverage area.

OBJECTS AND ADVANTAGES OF THE INVENTION

In light of the above, it is a primary object of the present invention to provide a method and apparatus for optimizing the placement of antennas in a communications distribution network in buildings and complex urban areas. It is another object of this invention to provide an optimization method that lowers the installation cost of such a network. It is another object of this invention to provide an optimization method that allows a designer to predict the performance of such a network before antenna installation. It is still another object of this invention to provide an optimization method that reduces the post-installation costs of maintaining such a network, by reducing the need for post-installation changes in network configuration. It is still another object of the present invention to provide a database of field strength measurements in different architectural categories, for predicting coverage in new buildings or urban areas comprising stored categories. It is yet another object of this invention to provide a method of predicting optimal installation sites for antennas in a new coverage area, using field strength data stored in a database. It is still another object of this invention to provide an apparatus for optimizing antenna placement in a communications distribution network, using field strength measurements. These and other objects and advantages will become more apparent after consideration of the ensuing description and the accompanying drawings.

SUMMARY OF THE INVENTION

A method and apparatus for optimizing the placement of repeater or base station antennas in a wireless communications distribution network are disclosed. Test antennas are placed at a number of sites within the coverage area, and the signal from each test antenna is measured at measurement locations within the coverage area. The measurement allows the simulation of the coverage provided by different arrangements of antennas. An optimum arrangement is then chosen. In a preferred embodiment, the optimum arrangement of antennas is chosen by maximizing a utility function that depends on the quality of the coverage within the area and on the cost of installing an arrangement. A database of architectural categories (building or urban area plans) and measurement results for each category is built by a method of the present invention. A new building is then matched to the closest component categories in the database, thus allowing the optimization of coverage in a coverage area without the measurement of signals from test antennas in the new building.

BRIEF DESCRIPTION OF THE DRAWINGS

FIG. 11-A shows the power received from an antenna, along a path within the building illustrated in FIG. 10.

FIG. 11-B shows the power received form one another antenna, along the path of FIG. 11-A.

FIG. 12-A shows the total power received from a configuration of two antennas, along the path of FIG. 11-A.

FIG. 12-B shows the total power received from a configuration of three antennas, along the path of FIG. 11-A.

DESCRIPTION

Figure 1:
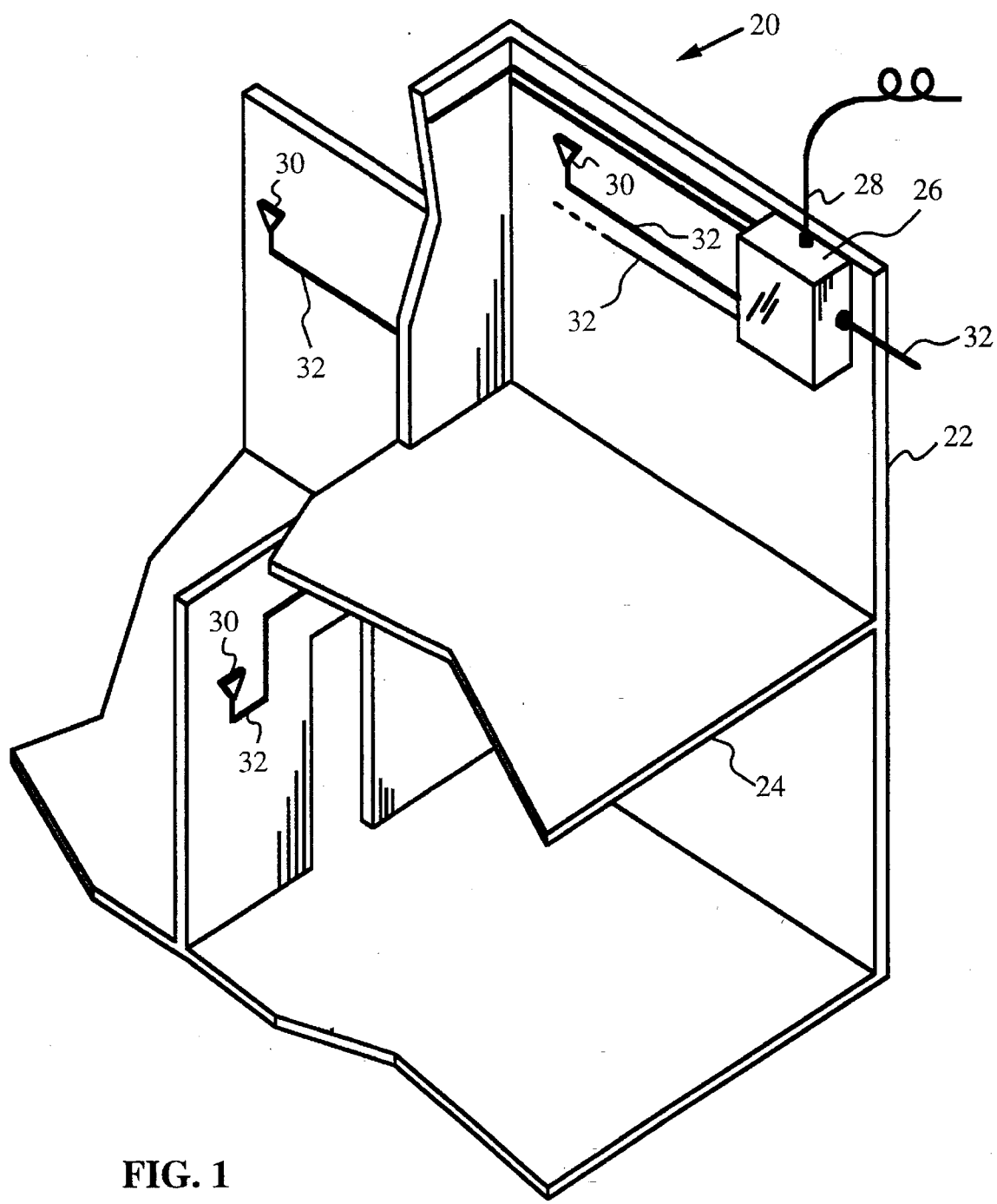
FIG. 1 is a perspective view of part of a coverage area, showing antennas and antenna connections.

FIG. 1 shows a part of an in-building coverage area 20 for wireless communications, having a wall 22 and a floor 24. Coverage area 20 is covered by a communications distribution system having a hub 26, a number of permanent antennas 30 and a number of links 32 connecting hub 26 to antennas 30. Links 32 are typically copper cables, but in general can comprise any combination of copper cables and optical fibers. If the distance between hub 26 and an antenna 30 is short (tens of meters), link 34 is preferably a copper cable. Permanent antennas 30 are typically antennas capable of sending and receiving signals in the radio-frequency (RF) range (up to 30 GHz), but can in general be antennas capable of communicating in millimeter wave (30–300 GHz) or optical (300 GHz–3 THz) frequencies. Hub 26 is typically a base station for cellular or cordless telephony, although in general each of antennas 30 can be a base station.

Coverage area 20, as shown, comprises part of a building, including parts of different rooms within a floor, and parts of different floors. A method of the present invention, however, can be applied as well in a complex urban or suburban area. A complex area is understood to mean any area having obstacles that shield a mobile user from electromagnetic fields. In such an area, the a priori prediction of the coverage provided by permanent antennas placed within the coverage area is very difficult. A permanent antenna is understood to mean a base station antenna or a repeater antenna used during the normal operation of the communications distribution system. A method of the present invention is particularly suited for the optimization of repeater placement inside buildings, and of base station placement in complex urban areas.

Figure 2:
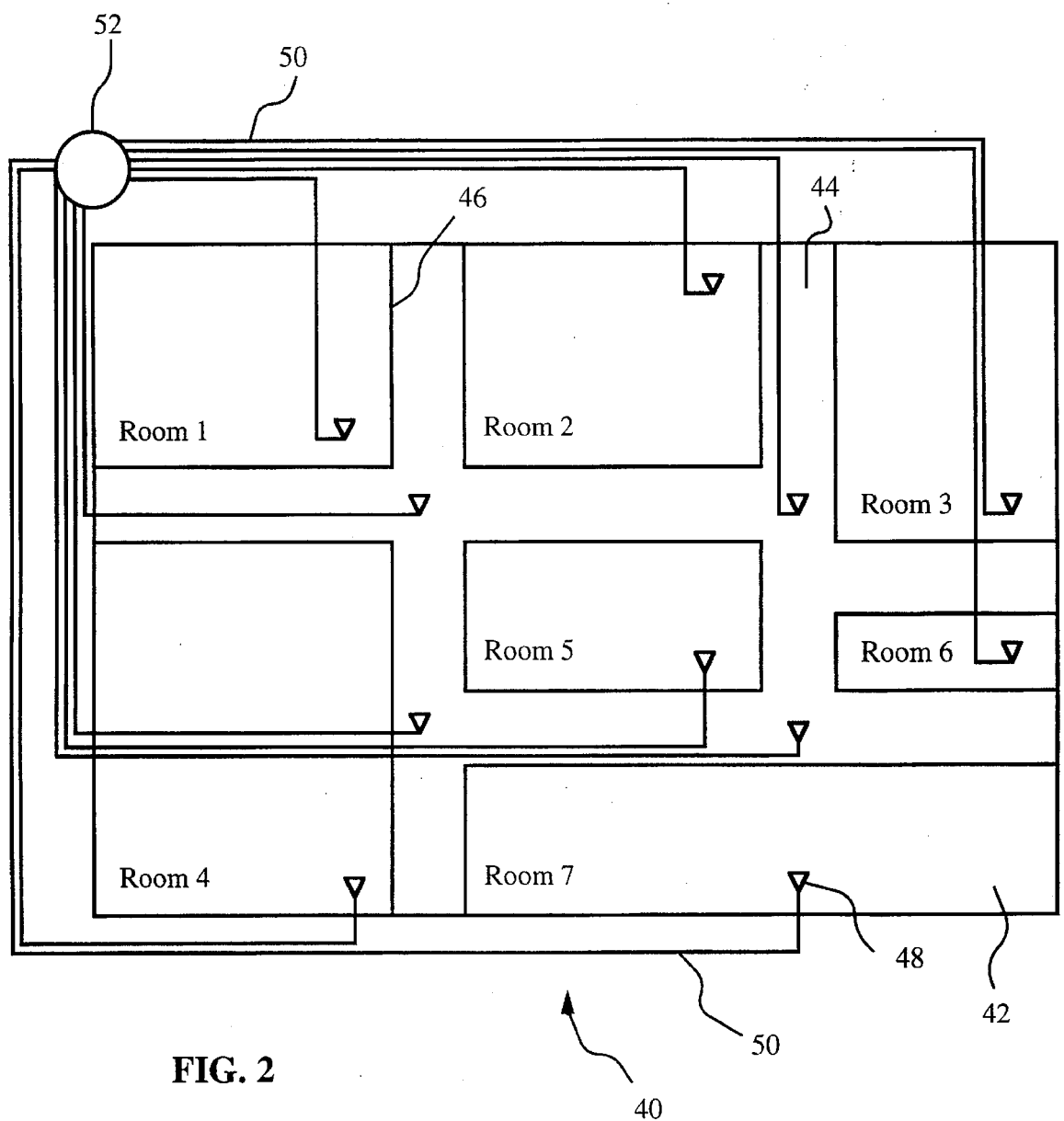
FIG. 2 shows an in-building coverage area and a typical prior-art permanent antenna arrangement within the coverage area.

FIG. 2 shows schematically an in-building coverage area 40 having rooms 42, hallways 44 and walls 46. For simplicity, the coverage area shown comprises part of a single floor. FIG. 2 illustrates a typical approach to providing coverage within an area such as area 40: permanent antennas 48 similar to antennas 30 are placed essentially in each room and hallway to ensure adequate coverage within area 40. In another approach, an experienced engineer qualitatively decides on the placement of permanent antennas 48 using a floor plan of coverage area 40. A number of links 50 connect antennas 48 to a hub 52 similar to hub 26. The typical approaches to antenna placement can be costlier than necessary, and can lead to undesired interference between signals from different antennas 48, or to inadequate coverage of area 40 if too few antennas 48 are installed.

A method of the present invention allows the determination, before the installation of antennas 48, of an optimal subset from the set of potential installation sites for permanent antennas 48 in a coverage area such as area 40.

Figure 3:
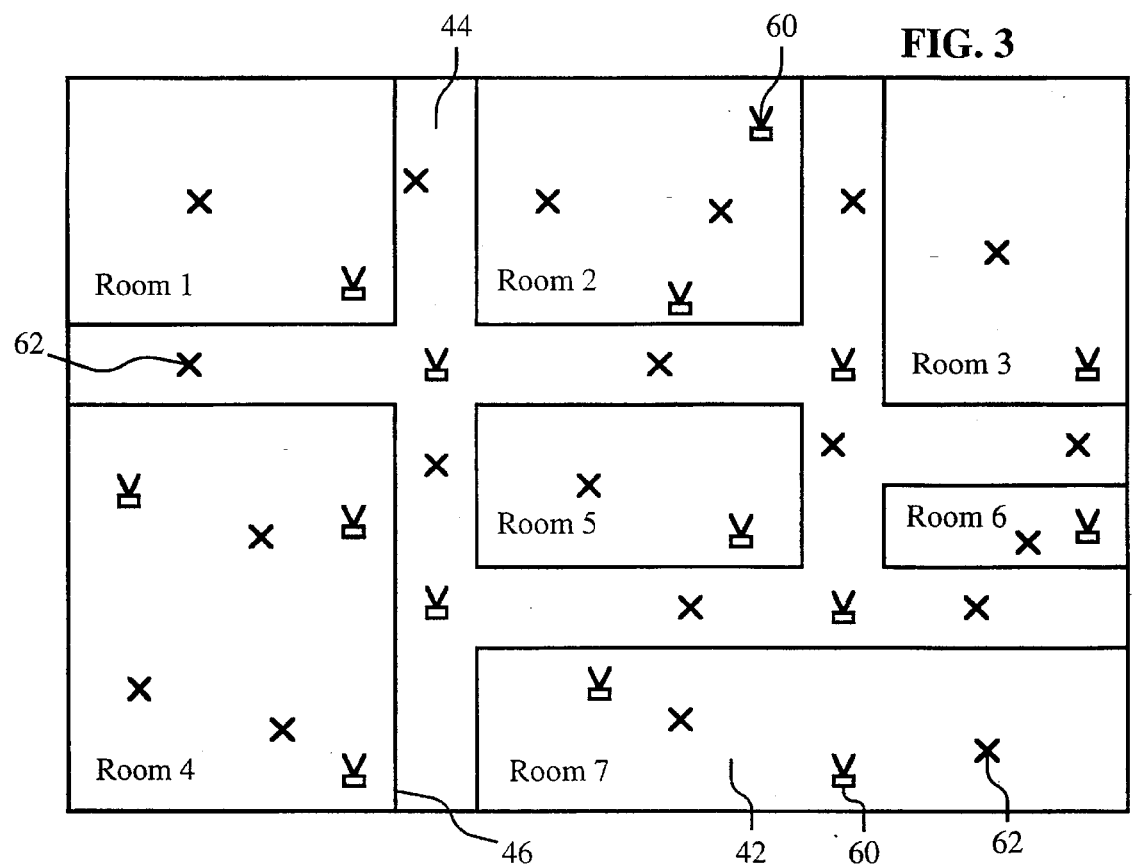
FIG. 3 illustrates a possible placement of test antennas within the coverage area of FIG. 2, according to the present invention.

In a method of the present invention, test antennas 60 are placed at test antenna sites within coverage area 40, as shown in FIG. 3. Preferably, test antennas 60 are similar in output characteristics (e.g. power, order of magnitude of frequency) to the permanent antennas to be installed. The test antenna sites are chosen from the set of potential installation sites for permanent antennas 48 and the set of potential communication unit locations. The set of potential installation sites includes sites on ceilings, high on walls, above suspended ceilings, and in general any site where a permanent antenna 48 can be installed. The set of potential communications unit locations includes locations within coverage area 40 where a person having a communications unit may need to use the unit.

An operator temporarily attaches (for example with stick-on tape) test antennas 60 at test antenna sites, with one test antenna per site. Preferably, a map or floor plan of coverage area 40 is available to the operator. The map typically comprises the walls of a building, but generally may include any obstacles that can influence the transmission of waves of the frequencies used in the communications network; for many applications, such frequencies are radio frequencies (up to 30 GHz).

In a preferred mode of operation, the operator records the test antenna sites on the map, and the identity of the test antenna at each antenna site. In a typical building, preferably one or two test antennas are placed in each room or hallway. A test antenna 60 emits radio frequency (RF) signals distinguishable from those of other test antennas by a distinguishing factor. The distinguishing factor can be the frequency of the signal from the antenna: a test antenna $T_1$ emits at a frequency $f_1$, an antenna $T_2$ at $f_2$, and an antenna $T_n$ at a frequency $f_n$.

The operator walks around coverage area 40 and measures the signal strengths from each of test antennas 60 at measurement locations 62, using an apparatus of the present invention. The signal strengths from test antennas 60 at a measurement location 62 are then stored, and the measurement locations are preferably recorded on the map.

Measurement locations 62 are chosen from the set of potential installation sites for permanent antennas 48 and the set of potential communication unit locations. Allowing the test antenna sites to include potential communications unit locations, and measurement locations 62 to include potential installation sites is important because of the equivalence of test antenna sites and measurement locations.

Figure 4:
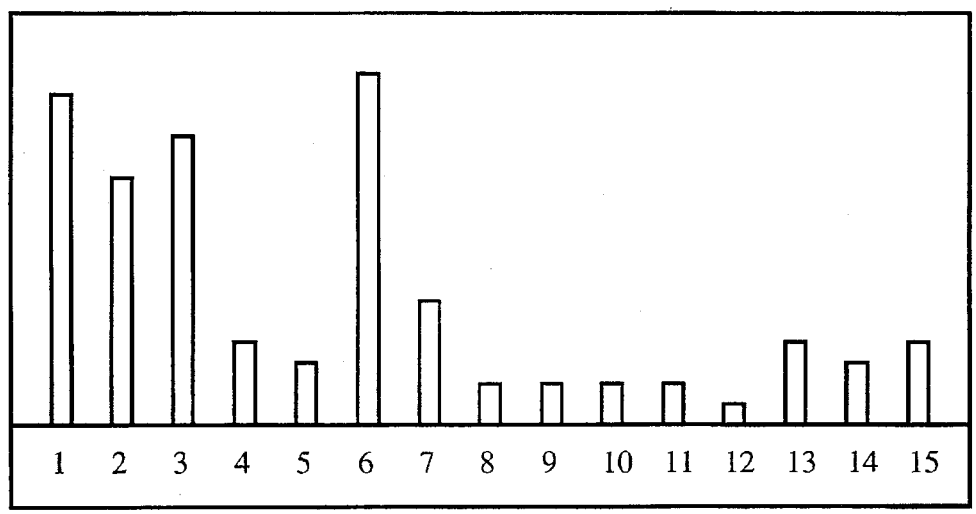
FIG. 4 is a schematic diagram showing the strengths at a measurement location of the signals from test antennas such as the ones shown in FIG. 3, according to the present invention.

A schematic example of signal strengths at a measurement location from a set of fifteen antennas 60 is shown in FIG. 4. Antennas close to a measurement location 62 will yield a strong signal at that measurement location, while antennas far away will yield a weaker signal. The measurement step is repeated at other measurement locations within the coverage area. Since the coverage provided by a typical test antenna arrangement (e.g. one test antenna per room) does not vary significantly over distances on the order of meters, it is usually enough to choose one or two measurement locations in each room or hallway in order to simulate the coverage provided virtually everywhere in the coverage area. In general, however, any number of measurement locations can be chosen, depending on the complexity of the coverage area and on the desired accuracy of the coverage simulation.

Figure 5:
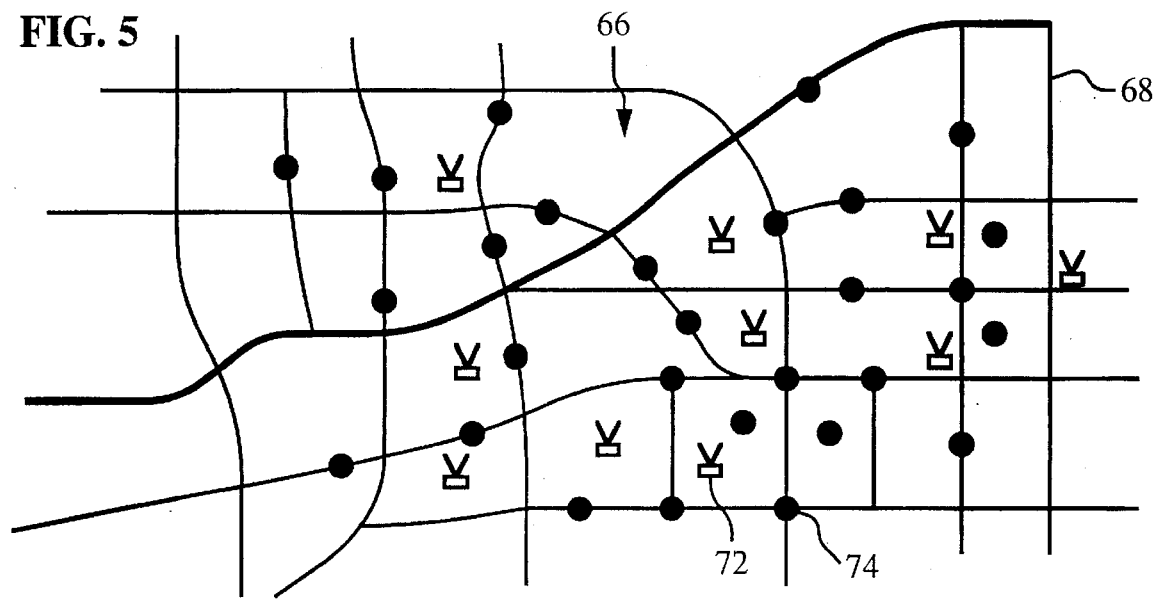
FIG. 5 shows a coverage area including part of an urban area, test antennas and measurement locations, according to the present invention.

A method of the present invention can also be used to optimize the placement of base stations in a complex urban area. FIG. 5 shows a hypothetical map of part of a city including a coverage area 66 and roads 68. The part of the city shown is expected to be serviced by one or two base stations whose placement is to be determined. Test antennas 72 are placed at test antenna sites within coverage area 66, and the signal strengths from test antennas 72 are measured at measurement locations 74. An operator having a measurement apparatus of the present invention preferably drives or walks along roads 68 and takes measurements of signal strengths. Clearly, however, measurement locations are not restricted to locations on roads. Suitable test antenna sites and measurement locations can easily be determined by the skilled artisan.

Figure 6:
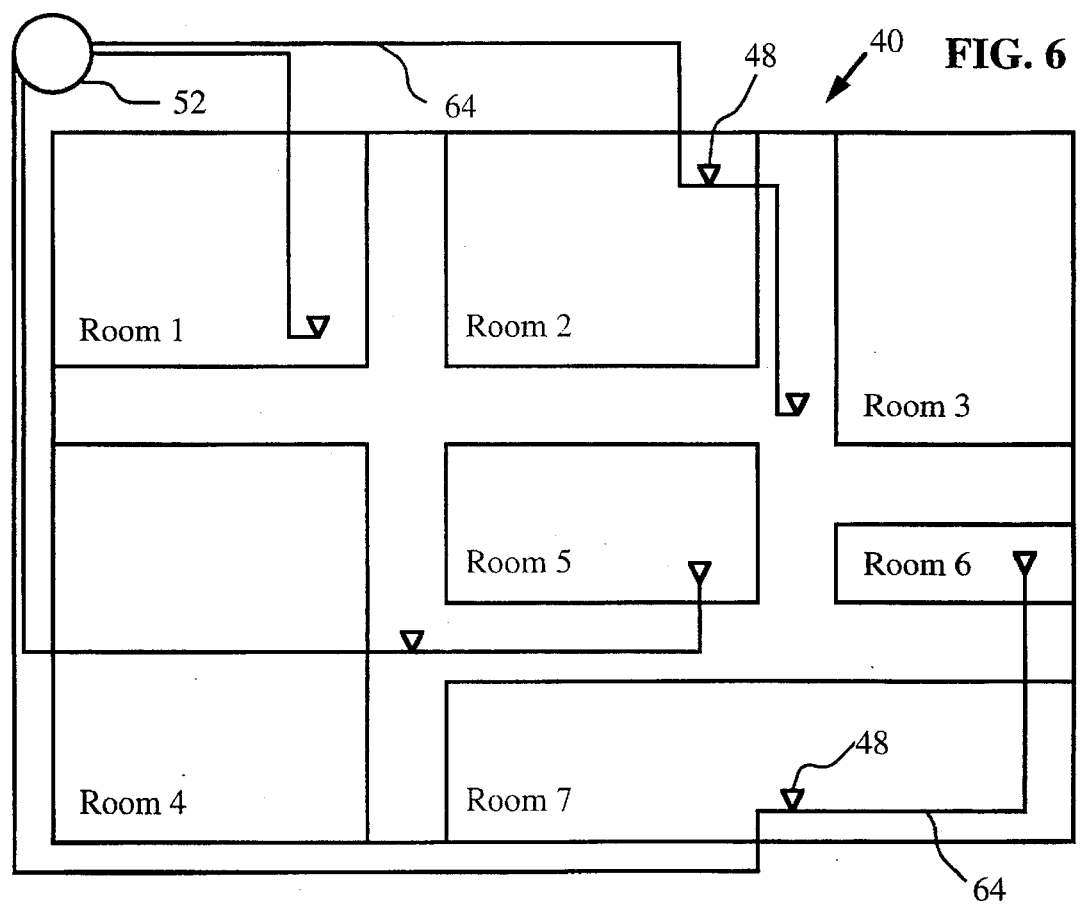
FIG. 6 shows a possible optimum arrangement of permanent antennas in the in-building coverage area of FIG. 2, according to the present invention.

Once the data from a coverage area has been collected, the data is entered into a program that determines the optimal subset of sites for placing permanent antennas within the coverage area. An optimal subset of sites is chosen, and permanent antennas are installed at the sites of the optimal subset. FIG. 6 shows a possible optimized arrangement for coverage area 40, where permanent antennas 48 are connected by a number of links 64 to hub 52.

There are many ways to choose an optimal subset of sites, and many ways to define what is optimal for a given application. A preferred way to quantify a particular definition of an optimal subset is to compute a utility function f for many subsets of sites, where f depends on a set of coverage parameters p1, p2, ..., pm. The optimal subset (or subsets) is then defined as the subset(s) having an optimal (e.g. maximum) value of f.

Figure 7:
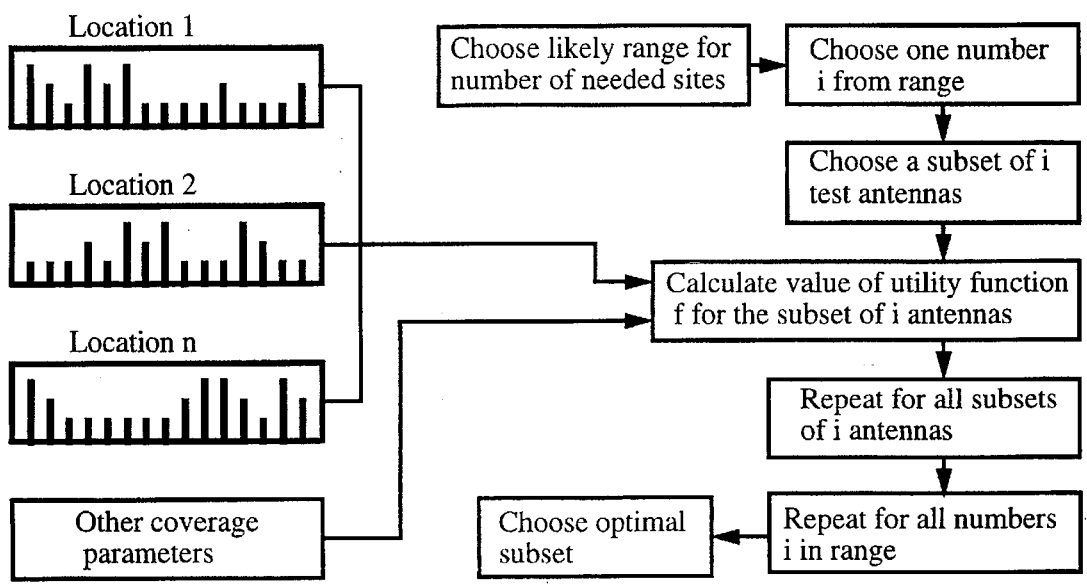
FIG. 7 is a schematic flowchart illustrating a method of selection of an optimal subset, according to the present invention.
Figure 8:
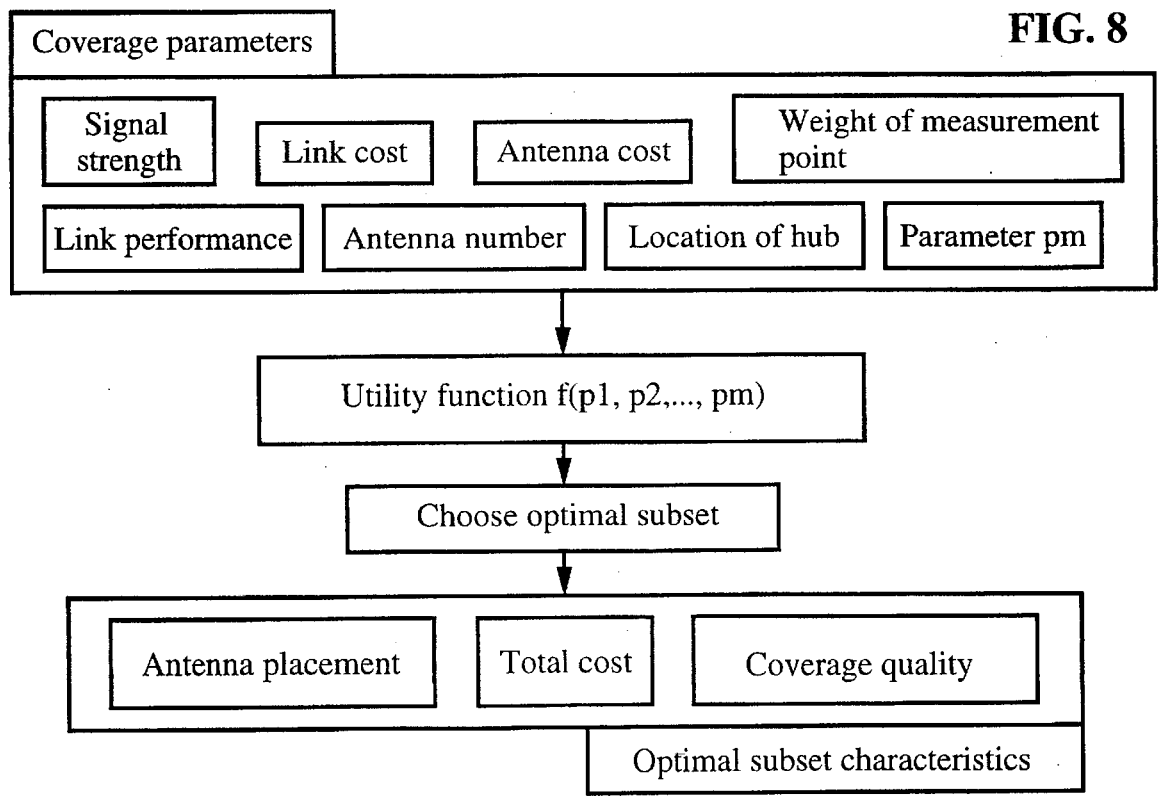
FIG. 8 is a flowchart similar to that of FIG. 6, illustrating in more detail possible coverage parameters that can be used by a utility function, according to the present invention.

FIG. 7 and 8 show simplified flowcharts of a method designed to select an optimal subset of installation sites based on a set of coverage parameters. For clarity of explanation, in the following discussion the equivalence of test antenna sites and measurement locations is not considered. As the skilled artisan will appreciate, a likely range for the number of permanent antennas needed to provide coverage to a coverage area can be estimated from the size of the coverage area and the power output and effective range of a permanent antenna. The program chooses one number i in that range, and a subset of i test antennas/test antenna sites. The program then calculates the value of a utility function f for that subset. If the number of test antenna sites and of measurement locations is so large as to make the evaluation of all subsets computationally impractical, it is possible to evaluate only a representative fraction of all possible subsets, for example by a Monte Carlo method.

Some of the parameters that function f can depend on are shown in FIG. 8: they include the dimension of part of the coverage area, the relative communications importance/weight of part of the coverage area, the cost of a permanent antenna, the cost of installing permanent antennas at the sites of a given subset, performance parameters (such as dynamic range) of a link, the cost of a given link length, the coverage quality within part of the coverage area as measured by the signal strengths from test antennas at measurement points within that part, as well as any other parameters that are relevant to the performance and/or cost of the distributed network. The location of the hub can be taken to be a fixed parameter, or can be factored in the utility function so as to minimize link lengths. The program determines for which subset(s) the utility function has an optimal value; that subset (or subsets) is/are then the optimal subset(s).

In a particular implementation of the above-described method, the program first chooses coverage subsets for which the coverage provided meets a predetermined condition, and then selects an optimal subset from the coverage subsets as described above. For example, the program computes a coverage function; the subsets for which the coverage function meets a given condition (e.g., the value of the coverage function is non-zero) are then selected as coverage subsets.

It is clearly possible to choose an optimal subset without explicitly computing a utility function. Any choice of an optimal subset based on the measured quality of coverage and/or other parameters, however, involves computing a utility function, at least implicitly. For example, it is possible to choose a single antenna that covers the largest number of measurement points in the coverage area. In this case, the optimal subset consists of the site of the single antenna. Alternatively, it is possible to choose as the optimal subset the subset of sites with the least number of measurement points where interference is observed. In both of the examples given above, a utility function is computed implicitly.

Building a database of measurements performed according to a method of the present invention allows the prediction of coverage in new coverage areas without the need for measurements within the new coverage area. Parts of typical buildings can be categorized in a finite number of architectural categories common to many buildings. Such categories include, among others: a hallway with a line of offices on either side of the hallway; a large open office space area with partitioned work areas; an elevator shaft leading into a lobby or reception area; a part of a building having a plan similar to that shown in FIG. 2; etc. Each category can have subcategories having narrower defining characteristics. For example, the category offices on e with offices on either side can include a subcategory having a 6 foot wide hallway and a 10 foot high ceiling. Clearly, many other categories and subcategories can be defined. In the ensuing description, the word category is understood for simplicity to encompass categories and subcategories.

As coverage is mapped within a building, measurement results and optimal installation sites for the architectural categories present in the building are stored in a coverage database. Such a database contains indicators to maps of coverage categories, measurement locations and test antenna sites within the map, as well as the measured signal strengths at each location. An indicator to a map may be the map itself, or a reference to a map stored elsewhere. Preferably, the database also contains computed optimal installation sites for each category.

To predict the coverage in a large new coverage area, the coverage area is broken down into its component architectural categories. For example, a coverage area may include a hallway with offices on both sides, and a large open space office area. The stored coverage categories closest to the coverage area architectural categories are determined. In principle, there are many ways to determine which stored category is closest to an architectural category of interest. In a simple implementation such a determination can be performed by a comparison of building plans.

The optimal subset of installation sites for the coverage area is then determined as described above, with the measurement data taken from the database instead of site measurements. Alternatively, the optimal subset for the coverage area may be taken to be the union of the optimal subsets for each of the component categories of the coverage area; this approach, however, does not take into consideration the interactions between antennas within different categories, and can lead to a less than optimal antenna and link placement.

Figure 9:
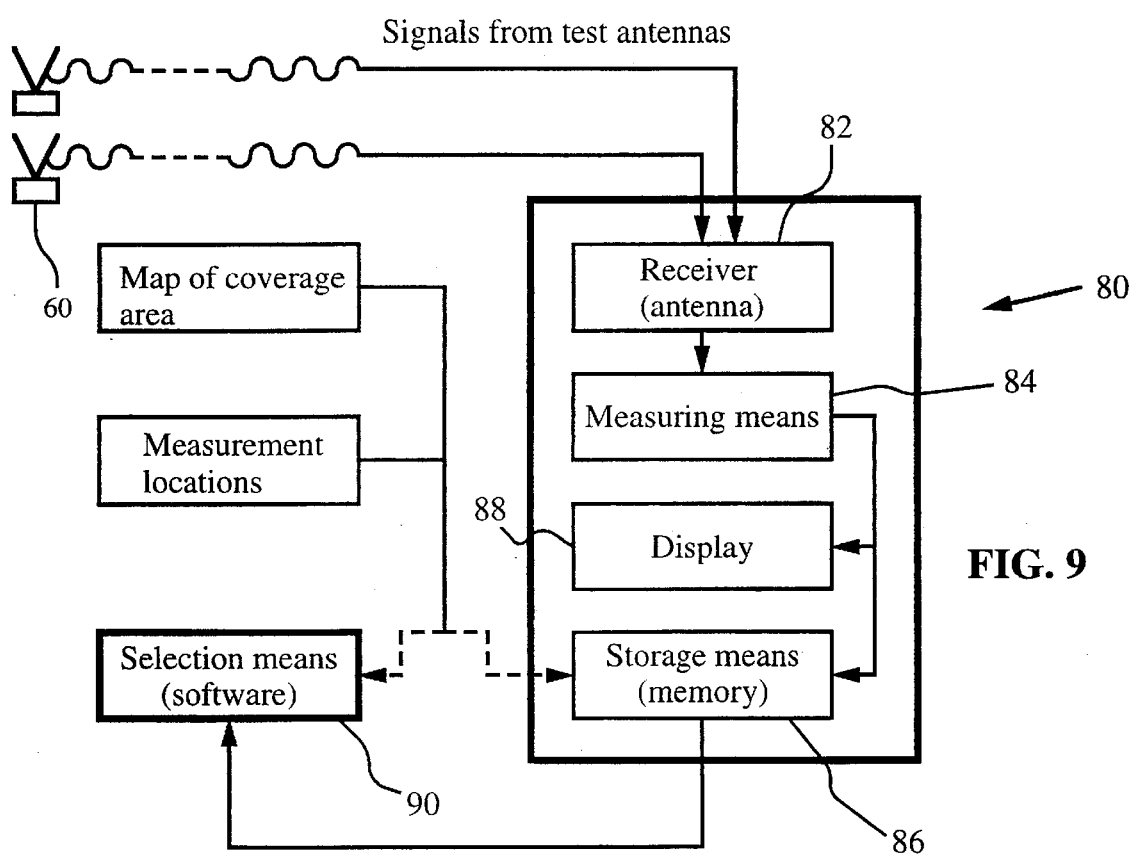
FIG. 9 is a schematic diagram of an apparatus of the present invention.

As shown in FIG. 9, an apparatus 80 of the present invention preferably includes test antennas 60 or 72, a receiver 82 for receiving signals from test antennas 60 or 72, measuring means 84 for measuring the strengths of the signals from test antennas 60 or 72, and storage means 86 for storing the signal strengths measured at each measurement location 62 or 74. Apparatus 80 can also include a display 88 for displaying to the operator the signal strengths as they are measured. The measurement results are transferred to selection means 90 and an optimal subset of installation sites is selected as described above.

In practice, receiver 82 is an antenna suitable for receiving signals from test antennas 60 or 72. Measuring means 84 can include an analog-to-digital converter, and storage means 86 can be a disk or computer memory. In a preferred embodiment, selection means 90 is computer software used to practically implement a method of the present invention. Receivers, storage means, displays, and ways to make them are well known in the art. Methods and tools needed to build an apparatus of the present invention are well known to a person of average skill in the art.

There are many ways to construct an apparatus of the present invention and to implement a method of selecting an optimal subset of installation sites, without departing from the spirit of the invention. The following examples only illustrate particular ways to implement a method of the present invention, and should not be construed to limit the invention.

EXAMPLE 1

Consider the case wherein a maximal value of f is taken to be optimal. Consider a set of measurement points $m_j$, and a set of signal strengths $s_{jk}$, where $s_{jk}$ is the signal strength at point $m_j$ from a test antenna $a_k$. Assign a set of (positive) weights $w_j$ to each point $m_j$; a weight $w_j$ is greater if $m_j$ is in an area of communications importance, such as a conference room, and is smaller if $m_j$ is in an area of lesser communications importance, such as a storage room. Then a coverage subfunction C for a subset of antenna sites can be $$C(m,s,w) = \prod_j (q_j)^{w_j} \quad [1]$$

where $q_j$ is a parameter measuring the quality of coverage at the point $m_j$. For example, $q_j$ can be $$q_j = \begin{cases} 0 \text{ if } \max_k s_{jk} < a \\ 0 \text{ if } \max_k s_{jk} > b \\ 0 \text{ if } \left(\max_k s_{jk}\right) - S_j < c \\ \max_k s_{jk} \text{ otherwise} \end{cases} \quad [2]$$

where $S_j$ is the second highest signal strength at $m_j$. That is, the quality coefficient $q_j$ for a given point is: zero if the signal from at least one test antenna does not exceed a predetermined value a (condition 1); zero if the signal from at least one test antenna exceeds a predetermined value b (condition 2); zero if the second highest signal strength $S_j$ approaches the maximum signal strength at $m_j$ (condition 3); and the maximum signal strength at $m_j$ otherwise (condition 4).

Condition 1 ensures that at least one test antenna provides a strong enough signal at $m_j$, while condition 2 marks the subsets that produce too strong a signal at $m_j$. Condition 3 is designed to penalize subsets that produce excessive interference at $m_j$, while condition 4 assigns a value to $_qj$. Clearly, a parameter such as $q_j$ can have many forms, depending on the application. Conditions such as 1–4 can also have many forms; in particular, a more sophisticated condition than condition 3 can be used to check for interference between antennas. Methods for evaluating coverage quality and interference are well known in the art.

Thus, the coverage subfunction C in the above example is zero if at least one of the measurement points $m_j$ is not covered ($q_j$=0) by test antennas placed at the sites of the subset, and has a finite value otherwise. A utility function f can consider only those subsets for which the coverage subfunction C is non-zero; such a method would in effect choose coverage subsets from the set of all subsets, where test antennas placed at the sites of a coverage subset provide coverage at all measurement points 62 or 74.

EXAMPLE 2

A utility function f can also depend on other parameters or subfunctions for each subset. For example, f may have a cost subfunction D depending on the cost of installing permanent antennas 48 at the sites of a subset, including the hardware costs of permanent antennas 48 and the costs of links 64.

EXAMPLE 3

Likewise, a coverage subfunction such as the subfunction C described in Example 1 may also depend on a link subfunction L that estimates the effects of the lengths of links 64 on the signals from permanent antennas 48. For example, such a subfunction L may correct the signal strengths $s_{jk}$ in formula 2 using a set of factors $l_k$, where $l_k$ depends on the distance between hub 52 and antenna $a_k$. A quality coefficient $q_j$ could then have a form similar to [2], with $s_{jk}$ replaced by $l_k s_{jk}$.

EXAMPLE 4

A fiber optic link with 120 db dynamic range costs about 10 times more, and can deliver signals three orders of magnitude stronger than a fiber optic link with a 90 db dynamic range. Using 120 db links instead of 90 db links thus reduces the number of links and permanent antennas to be installed, but raises the cost per link. Thus, there is an optimal number of permanent antennas and corresponding dynamic range links that maximize the performance/cost ratio of the distribution network.

EXAMPLE 5

Figure 10:
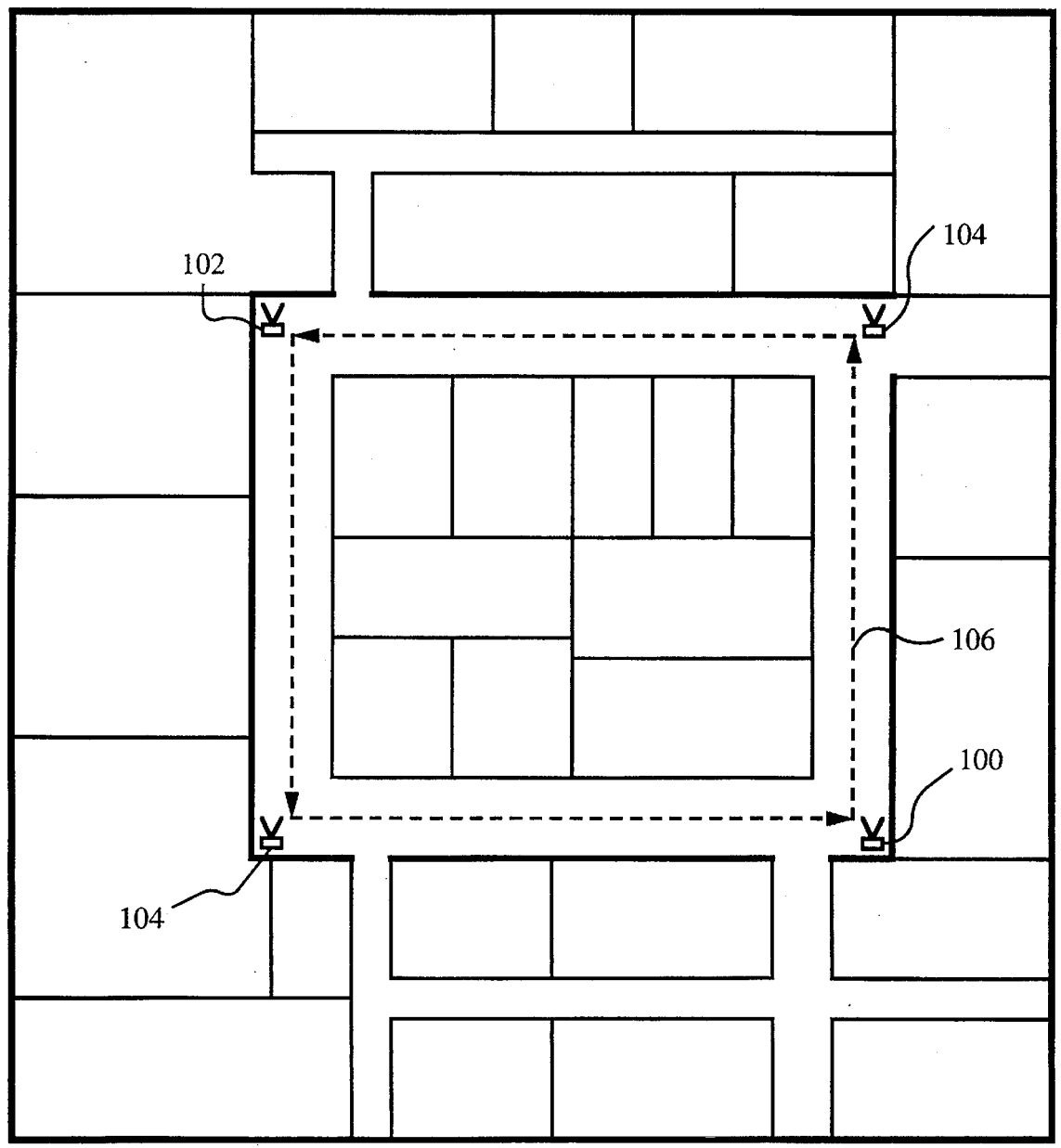
FIG. 10 shows a simplified plan of a building where test measurements were performed according to the present invention.

Determining an optimal placement of antennas by a method of the present invention does not require the explicit calculation of a utility function, especially if a small number of test antennas is used. FIG. 10 shows a simplified plan of a building where test measurements were performed. Test antennas 100, 102, and 104 were placed at sites in a hallway, and the signals from the test antennas were measured at measurement locations along a path 106. FIG. 11-A and FIG. 11-B show the received powers from antennas 100 and 102 along path 106; for clarity of presentation, the graphs shown are space-averaged.

Several alternative configurations were evaluated: antenna 100 alone configuration 1), antennas 100 and 102 (configuration 2) and antennas 100, 102 and 104 (configuration 3). The total received powers along path 106 for configurations 2 and 3 are shown in FIG. 12-A and FIG. 12-B, respectively. The ranges of the received powers, the required spur-free dynamic ranges (SFDR), and the percentages of path 106 defined to be "over-covered" are listed in Table 1 for each configuration:

TABLE 1

| CONFIGURATION | 1 | 2 | 3 |
| --- | --- | --- | --- |
| Range of Received Powers (db) | 68.0 | 35.7 | 23.0 |
| Required SFDR (db-Hz$^{2/3}$) | 115.8 | 83.5 | 70.8 |
| Percent of Path Over-Covered (%) | 0 | 2.8 | 39.5 |

The choice of configuration depends in general on what is considered optimal for the particular application. For the example above, the optimal configuration was chosen to be configuration 2.

EXAMPLE 6

Consider a coverage area including one or more architectural categories. The most accurate determination of an optimal subset is performed by taking field strength measurements in the area, as described above. An optimal subset can also be determined for such a coverage area using field strength measurements previously taken in an architecturally similar coverage area.

Previous field strength measurements can be used in many ways for the determination of an optimal subset in a new area. Some possible ways include, listed in increasing order of sophistication and accuracy:

A. The optimal subset for the new area is chosen to be substantially identical to a previously determined optimal subset for the old area.
B. The optimal subset for the new area is chosen using a new utility function tailored to the new area. For example, architecturally similar rooms may have different functions in the new area than in the old area; such functions would be reflected in the weighting coefficients $w_j$ described in Example 1.
C. The old field strength measurements are scaled to the dimensions of the new area. Such a scaling can be done for example by taking into account the $1/r^2$ decay of signals in free space. The new optimal subset is computed using the scaled measurements.
D. For large areas including many architectural categories, the new area is broken down into stored architectural categories. Ideally, the stored architectural categories are overlapping, so that interactions between antennas in different categories can be taken into account. A utility function is then optimized using the stored results from all the component categories. Such an optimization method takes into account interactions between antennas in different categories.

SUMMARY, RAMIFICATIONS, AND SCOPE

It is clear that there are many ways to implement a method of optimizing the placement of antennas in a wireless communications distributions system, without departing from the spirit of the invention. Many implicit or explicit utility functions can be used. Clearly, a method of the present invention is most suitable for use inside buildings and in complex urban areas, but such a method can be used in any area where the a priori prediction of coverage is difficult. There are many ways to design and to use a database of the present invention. Therefore, the scope of the invention should be determined not by the examples given, but by the appended claims and their legal equivalents.

We claim:

1. A method of optimizing the placement of permanent antennas in a coverage area of a wireless communications distribution system, said method comprising the steps of:

a) placing a test antenna at a test antenna site within said coverage area, said test antenna site being chosen from a set of potential installation sites for said permanent antennas and a set of potential communication unit locations;

b) measuring a strength of a signal from said test antenna at a measurement location within said coverage area, said measurement location being chosen from said set of potential installation sites and said set of potential communication unit locations;

c) storing said strength; and d) choosing from said see of potential installation sites an optimal subset of installation sites for installing said permanent antennas.

2. The method of claim 1, wherein choosing said optimal subset comprises the steps of:

a) choosing a subset of said set of potential installation sites;

b) computing the value of a utility function for said subset, said value depending on a coverage parameter of said subset; and c) if said value is an optimal value of said utility function, choosing said subset as an optimal subset.

3. The method of claim 2, wherein said coverage parameter is selected from the group consisting of a dimension of part of said coverage area, a relative communications importance of part of said coverage area, a cost of at least one of said permanent antennas, an installation cost for said at least one of said permanent antennas, a performance parameter of a link used to connect said at least one of said permanent antennas to a hub, a cost of a given link length, said strength, and a quality within part of said coverage area of a coverage provided by permanent antennas placed at said sites of said subset.

4. The method of claim 1, wherein choosing said optimal subset comprises the steps of:

a) choosing a subset of said set of potential installation sites, said subset being charaterized by a first coverage parameter and by a second coverage parameter, said first parameter not being necessarily distinct from said second parameter;

b) computing a coverage value of a coverage function for said subset, said coverage value depending on said first parameter;

c) if said coverage value meets a predetermined condition, computing a utility value of a utility function for said coverage subset, said utility value depending on said second parameter; and d) if said utility value is an optimal value of said utility function, choosing said subset as an optimal subset.

5. The method of claim 1, comprising the step of placing a second test antenna at a second test antenna site.

6. The method of claim 5, wherein said signal is distinguishable from a second signal from said second test antenna by a distinguishing factor.

7. The method of claim 6, wherein said distinguishing factor is the frequency of said signal.

8. The method of claim 1, wherein said coverage area comprises a part of a building.

9. The method of claim 1, wherein said coverage area comprises a part of a complex urban area.

10. The method of claim 1, wherein said set of potential installation sites comprises a site selected from the group consisting of ceiling sites, wall sites, and sites above a suspended ceiling.

11. The method of claim 1, wherein said permanent antennas are repeater antennas for wireless communications.

12. The method of claim 1, wherein said permanent antennas are base station antennas for wireless communications.

13. A method of building a coverage database for optimizing, the placement of permanent antennas and for simulating the coverage provided in a coverage area by an arrangement of permanent antennas of a communications distribution system, said method comprising the steps of:

a) storing in said database an indicator to a map of said coverage area, said map including a location of an obstacle within said coverage area;

b) placing a test antenna at a test antenna site within said coverage area, said test antenna site being chosen from a set of potential installation sites for said permanent antennas and a set of potential communication unit locations;

c) measuring a signal strength from said test antenna at a measurement location within said coverage area, said measurement location being chosen from said set of potential installation sites and said set of potential communication unit locations; and d) storing said signal strength in said database.

14. The method of claim 13, further comprising the step of storing in said database said measurement location and said test antenna site.

15. The method of claim 13, wherein said indicator comprises said map.

16. The method of claim 13, wherein said permanent antennas are repeater antennas for wireless communications.

17. The method of claim 13, wherein said permanent antennas are base station antennas for wireless communications.

18. A method of selecting an optimal subset from a set of potential installation sites for permanent antennas in a coverage area of a wireless communications distribution system, said coverage area comprising an architectural category, said method comprising the steps of:

a) selecting from a coverage database a closest stored coverage category, said closest stored coverage category being a stored coverage category architecturally similar to said architectural category;

b) selecting from said coverage database a measurement result for said closest stored coverage category;

c) choosing a subset of a set of potential installation sites, said subset being characterized by a coverage parameter;

d) computing a utility value of a utility function for said subset, said value depending on said coverage parameter and said measurement result; and e) if said utility value is an optimal value of said utility function, choosing said subset as said optimal subset.

19. The method of claim 18, wherein said measurement result is selected from the group consisting of a test antenna site, a measurement location, and a measured signal strength at said measurement location from a test antenna placed at said test antenna site.

20. The method of claim 18, further comprising the step of installing permanent antennas at the sites of said optimal subset.

21. The method of claim 18, wherein said permanent antennas are repeater antennas for wireless communications.

22. The method of claim 18, wherein said permanent antennas are base station antennas for wireless communications.

23. A method of optimizing the coverage provided in a coverage area of a wireless communications distribution system by an arrangement of permanent antennas, said coverage area comprising an architectural category, said method comprising the steps of:
 a) selecting from a coverage database a closest stored coverage category, said closest stored coverage category being a stored coverage category architecturally similar to said architectural category;
 b) selecting a stored optimal subset of installation sites for said closest stored coverage category; and
 c) selecting an optimal subset of installation sites for said architectural category, said optimal subset being substantially identical to said stored optimal subset.

24. The method of claim 23, wherein said permanent antennas are repeater antennas for wireless communications.

25. The method of claim 23, wherein said permanent antennas are base station antennas for wireless communications.

26. An apparatus for optimizing the placement of permanent antennas in a coverage area of a wireless communications distribution system, said apparatus comprising:
 a) a test antenna;
 b) a measuring means for measuring the strength of a signal from said test antenna; and
 c) a storage means for storing said strength, said storage means being capable of communication with said measuring means; and
 d) a selection means for choosing an optimal subset of installation sites from a set of potential installation sites for said permanent antennas, said selection means being capable of communication with said storage means.

27. The apparatus of claim 26, wherein said apparatus further comprises a second test antenna, said signal being distinguishable from a second signal from said second test antenna by a distinguishing factor.

28. The apparatus of claim 27, wherein said distinguishing factor is the frequency of said signal.

29. The apparatus of claim 26, wherein said test antenna is battery powered.

30. The apparatus of claim 26, wherein the frequency of said signal is a radio frequency.

* * * * *